United States Patent [19]

Ichinose et al.

[11] Patent Number: 4,960,485
[45] Date of Patent: Oct. 2, 1990

[54] AUTOMATIC WAFER MOUNTING DEVICE

[75] Inventors: Yusaku Ichinose, Ome; Hitoshi Imamura, Kofu, both of Japan

[73] Assignee: Enya Mfg. Co., Ltd., Saitama, Japan

[21] Appl. No.: 200,042

[22] Filed: May 27, 1988

[30] Foreign Application Priority Data

Jun. 19, 1987 [JP] Japan ................... 62-151352

[51] Int. Cl.⁵ ................ B65H 5/04; B65H 5/18
[52] U.S. Cl. ..................... 156/556; 156/499; 156/562; 156/567; 156/572; 156/578
[58] Field of Search ........... 156/539, 556, 571, 572, 156/578, 562, 499, 567

[56] References Cited

U.S. PATENT DOCUMENTS

| | | | |
|---|---|---|---|
| 2,651,429 | 9/1953 | Von Hofe | 156/572 |
| 4,088,522 | 5/1978 | Mercier et al. | 156/578 |
| 4,239,567 | 12/1980 | Winings | 156/154 |
| 4,273,607 | 6/1981 | Paul | 156/578 |
| 4,283,242 | 8/1981 | Regler et al. | 156/154 |
| 4,395,300 | 7/1983 | Hoffmann | 156/556 |
| 4,420,362 | 12/1983 | Valimont et al. | 156/556 |
| 4,557,785 | 12/1985 | Ohkuma | 156/345 |
| 4,637,850 | 1/1987 | Suzuki et al. | 156/571 |

Primary Examiner—Michael Wityshyn
Attorney, Agent, or Firm—Emmanuel J. Lobato; Robert E. Burns

[57] ABSTRACT

A wafer mounting device for automatically adhering wafers individually on a polishing plate surface for polishing the surface of the wafers. The wafers are stacked in a wafer cassette and are taken out from the wafer cassette one-by-one, and transferred to an adhesive coating section of the device by a wafer carrying means. The surface of each of the wafers is coated with an adhesive wax in a coating section. Afterward the adhesive coated wafers are carried out from the coating section by the carrying means. The wafers are taken out from the carrying means and the surfaces thereof are reversed by a reverse chuck means. The polishing plate is disposed in a position automatically where the reversed wafers arrive, and the wafers are automatically adhered onto the surface of the polishing plate.

19 Claims, 5 Drawing Sheets

AUTOMATIC WAFER MOUNTING DEVICE

BACKGROUND OF THE INVENTION

1. Field of the Invention

The present invention relates to a wafer mounting device for mounting wafers on a polishing plate, more particularly, relates to a wafer mounting device for coating an adhesive agent on the upper surface of individual wafers and adhering the wafers onto a polishing plate by such adhesive agent.

2. Description of Related Art

In order to obtain wafers which have flatness or to treat thin wafers, a plurality of wafers are adhered on a polishing plate and are polished by mounting the polishing plate in a polishing machine.

Conventionally, the aforesaid treatment is effected by coating an adhesive wax manually on the polishing plate made of ceramics. Pyrex (trademark) or the like, and mounting manually the wafers thereon, and/or by coating an adhesive wax on each of the wafers manually and mounting each of the wafers individually. These treatments have defects due to the manual work involved such as that it was difficult to prevent adhesion of dust even if the work was performed in a dust-free section and/or it was difficult to mount wafers on the polishing plate in the same level position as performed by machinery. Therefore, work efficiency was not satisfactory and accordingly, there existed a problem of treatment ability.

SUMMARY OF THE INVENTION

The primary object of this present invention is to provide an automatic wafer mounting device which can mount wafers on a polishing plate automatically without utilizing manual labor.

Another object of the present invention is to provide a wafer mounting device which can adhesively hold wafers onto a polishing plate evenly, i.e., can minimize variation of wax thickness which can be polished on a plurality of wafers on the polishing plate in almost uniform thickness.

The above objects of the present invention are attained by providing a wafer mounting device comprising;

a carrying or carrier means which transfers wafers, and puts them on a polishing plate one by one, a spin chuck means which is provided to permit up and down movement and receiving wafers from the carrying means during the upward movement, turning wafers at the top position, and replacing wafers to the carrying means during the downward movement, an adhesive agent coating means which is provided at the upper portion of the spin chuck means and drips adhesive agent on to the wafers, a reverse chuck means which inverts the side of wafers on which adhesive agent is coated and removes outwardly the wafers from the carrying means, and a means for holding the polishing plate at the predetermined place so as to adhere the wafer ejected from the carrying means in reversed position onto the surface of the polishing plate.

The above and further objects of the present invention will become apparent from the following detailed description when read in conjunction with the accompanying drawings.

BRIEF DESCRIPTION OF THE DRAWINGS

FIG. 4 through 8 show an orientation-flat aligning device.

DESCRIPTION OF THE PREFERRED EMBODIMENTS

Figures 1, 2, 3:
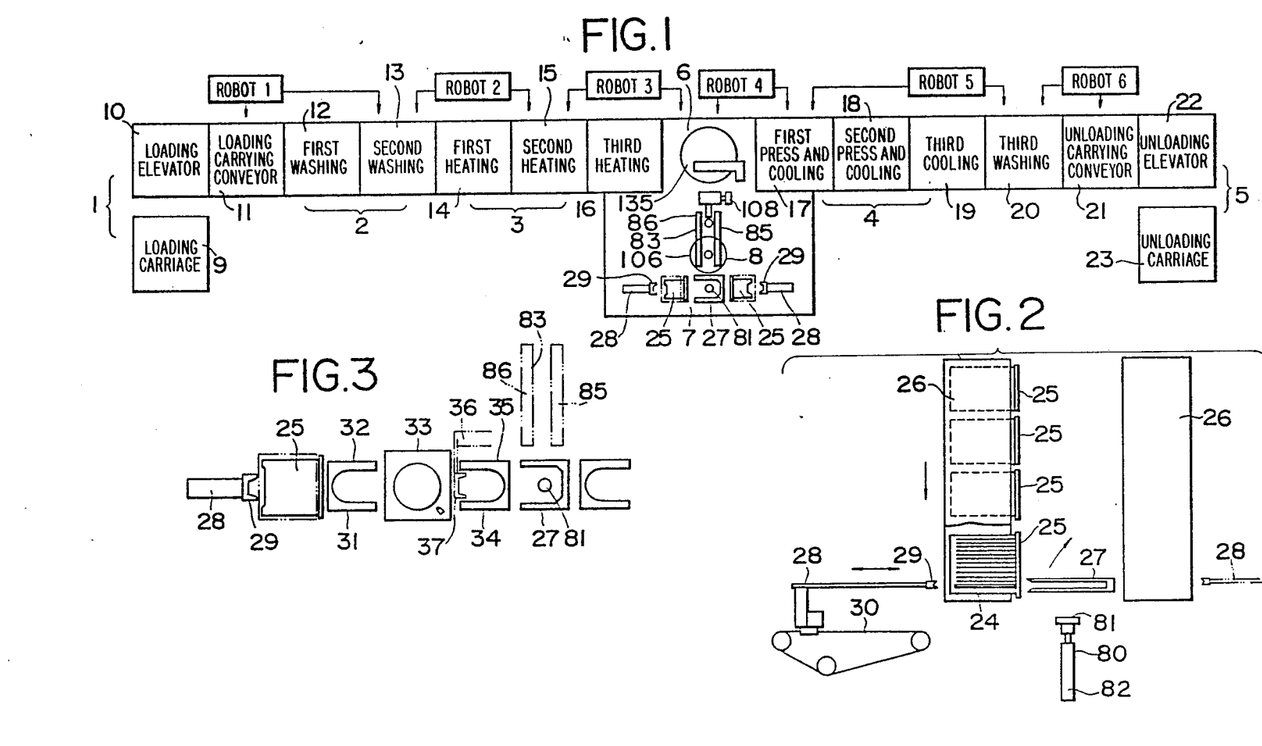
FIG. 1 is an flow diagram showing the structures of the wafer mounting device of the present invention.
FIG. 2 is a partially exposed side elevational view of the wafer supplying section in which one of the pushing devices is omitted.
FIG. 3 is a plane view of the wafer supplying section in which a scrubber device is interposed.

FIG. 1 is an explanatory view showing entire components of the devices of the present invention. As shown in this figure, a wafer mounting device of the present invention has in sequence a loading section (1), a washing section (2), a heating section (3), a press and cooling section (4) and an unloading section (5) of the polishing plate. Between the heating section (3) and the cooling section (4), an adhering section (6) of wafers is provided and an outer side of the adhering section (6) has a supplying section (7) for supplying wafers and a coating section (8) for applying adhesive agent on such wafers.

Treatment of the Polishing Plate

The aforementioned polishing plate is transferred to each processing stage in sequence order by each corresponding transfer robot 1 through 6 respectively in which they are able to move between a predetermined range. This transference of the polishing plate may also be performed by the tact system, the conveyor system etc. or manually.

A plate box (not illustrated) in which a plurality of the polishing plates are placed on the shelf like members thereof in a stack laid one on top of another, is transferred from a moveable loading carriage (9) to a loading elevator (10). Each of the polishing plates is picked out from the shelf like members of the plate box by a loading carrying conveyor (11), when the loading elevator (10) is moved downward in succession.

The polishing plates are transferred onto the carrying conveyor (11) and are routed to the washing section (2) by the transfer robot 1. This washing section is provided to pre-wash the polishing plates. In the drawing, during the first washing (12) the polishing plates are scrubbed using organic solvent or alcohol or the like, and during the second washing (13) the plates are scrubbed or rinsed using pure water.

The polishing plates treated in the washing section (2) are moved to the heating section (3) by the transfer robot 2. Preferably the heating section is applied in several stages to heat them gradually. In the drawing, during the first heating (14) temperature is at about 60° C., the second heating (15) about 100° C., and the third heating (16) about 120° C. Heating time may be varried in accordance with the nature of the polishing plate or adhesive agent, and also the temperature may be also altered during each stage.

The transfer robot 3 transfers the heated polishing plate at the predetermined temperature onto the adhering section (6). If the polishing plate has been heated higher than the predetermined temperature during the third heating (16), the transfer robot 3 is programed to remove the polishing plate apart from the heating elements (not illustrated) until the proper temperature is attained.

The polishing plate on which a plurality of wafers are adhered at the predetermined place as mentioned below, is transferred into the press and cooling section (4) by the transfer robot 4. In the press and cooling section (4), the polishing plate is secured by a press to firmly fix the wafers onto the polishing plate, and at the same time, is cooled gradually. In the drawing, the first cooling stage (17), the second cooling stage (18) and the third cooling stage (19) are provided to cool them gradually.

If superfluous adhesive agent has adhered onto the wafers attached to the polishing plate, the polishing plate is transferred into the third washing section (20) by the transfer robot 5, and wherein the polishing plate is washed and dried after scrubbing with organic solvent, rinsing by alcohol, blowing $N_2$ gas thereon, etc. The third washing may be omitted if the polishing plate is free from contamination.

Thus, the polishing plate is transferred onto an unloading carrying conveyor (21) by the transfer robot 6, and through the carrying conveyor (21) each of the wafers is received one by one into a plate box (not illustrated) supported by the unloading elevator (22). The plate box is carried to the polishing machine by the moveable unloading carriage (23) after receiving predetermined number of the polishing plates therein.

Supply of Wafers

The wafer supplying section (7) is constituted as shown mainly in FIG. 2. In the drawing, a cassette (25) in which 25 pieces of wafers are placed on shelves, is respectively received, stacked four stairs in the carrier boxes (26), (26) which are provided oppositely to face each other. Between these carrier boxes, an orientation-flat aligning device (27) is provided. These carrier boxes are supported on an elevator means (not illustrated), and the elevator means causes the carrier boxes to move downward successively so that the wafers are successively opposed to the orientation-flat aligning device from the upper positioned wafer to the lower positioned one when subjected by a pusher 28 mentioned below.

On the side of carrier boxes (26), (26), the pushers (28) are provided respectively. The pusher (28) has a pushing plate (29) which is moveable in a horizontal direction and one end of the pushing plate (29) is fixed to a chain (30) which is moved by means of a motor, sprockets, etc. A limit switch (not illustrated) provided at the proper position limits movement of the chain and permits reciprocating movement of the pushing plate (29) in the predetermined range. When the pushing plate (29) is advanced, the end thereof enters into the cassette (25) through an opening at an individual rear face thereof and ejects the wafer (24) into the orientation-flat aligning device (27) and returns to its original position. This operation continues until all wafers placed in the cassettes in one carrier box (26) have been ejected one by one. After completion, wafers in the other carrier box (26) are ejected in the same manner as mentioned above, by the other pusher in motion. In the meantime, empty cassettes (25) are taken out from the carrier box and new cassettes filled with wafers are replaced. As mentioned above, the wafers are supplied successively into the orientation-flat aligning device one by one.

FIG. 3 shows an example in which the wafers taken out from the cassette are supplied after washing by a scrubber. Between the pusher (28) and cassette (25) and the orientation-flat aligning device (27), each of which has the same constitution as shown in FIG. 2, is sequentially provided a loader (32) for receiving wafers which has a slide rail (31) near to a carrier box, not illustrated, etc. a scrubber device (33) and an unloader device (35) having a slid rail (34) for taking out wafers from the scrubber device (33). The slide rail (31) of the loader (32) alternates between the receiving position (illustrated position) of wafers ejected from the cassette and the carrying position of wafers into the scrubber device (33). The scrubber device (33) chucks preferably the carried wafers by their peripheral end portion and washes both sides of the wafers simultaneously with a water jet. The unloader device (35) is provided to enable alternate movement similar to the loader device, an the slide rail (34) receives the wafers when it is transferred into the scrubber device (33) and removes the wafer outside of the scrubber device when the unloader device is returned to the position as illustrated in the drawing. At the upper portion of the unloader device (35), it is preferable to provide heating means such as infrared lamps and the like to evaporate the remaining adhesive material on the wafers (not illustrated). To maintain close relationship with the unloader device (35), the pusher (36) is provided. Ordinarily the pusher (36) keeps a push plate (37) provided at the front portion thereof over the slide rail (34) of the unloader device (35) so that the push plate does not prevent the movement of the unloader device (35). And when the unloader device (35) is located at the position shown in the drawing, the pushing plate moves downward to the right and ejects the wafers placed on the slide rail (34) to the orientation-flat aligning device (27). When the unloader returns to the position shown in the drawing, the pushing plate (37) moves upward to the position over the slide rail (34).

When the orientation of the wafers placed on the cassette is in a predetermined flat orientation, the orientation-flat aligning device may be omitted, and it is possible to supply wafers to carrying means mentioned below by using other suitable means.

Orientation-Flat Aligning Device

In FIG. 4 through 8, one of the embodiments of an orientation-flat aligning device (27) is shown. This device has supporting arms (40), (41) which are faced opposite to each other and include receiving grooves (38), (39) to enable insertion of wafers from a side direction, and each of the supporting arms (40), (41) is respectively fixed by sliding shafts (43), (44) and (45), (46) inserted slidably throughout a body (42). Each of the sliding shafts (43), (44) and (45), (46) is respectively coupled with coupling boards (47), (48) at the rear end thereof. Inside of the body (42), bores (50), (51) which are connecting with a through hole (49) are provided, and piston rods (54), (55) of pistons (52), (53) inserted into the bores (50), (51) are respectively extended to the front or rear of the body (42). The front piston rod (54) is fixed to the base end of the supporting arm (40) (refer to FIG. 6). The rear piston rod (55) is fixed to the coupling board (48) being coupled with the rear end of the sliding shafts (45), (46) which operate another supporting arm (41) (refer to FIG. 7). When compressed air has been introduced into the through hole (49) through a hole (56), the pistons (52), (53) are moved outwardly (opposite direction from each other), namely, in FIG. 4, movement of the supporting arm (40) is to the left and the supporting arm (41) to the right, and, distance therebetween extends. Thus, the supporting arms (40), (41) release the wafers being held therebetween. Whereas, when compressed air has been introduced into the bores (50), (51) through the holes (57), (58), the pistons (52), (53) move inwardly (approaching direction) to each other, namely the supporting arm (40) moves to the right and the supporting arm (41) to the left. As a result, the distance decreases between the supporting arms and the get near to each other and return to the state as illustrated in the drawing. In this state, when the wafer is inserted from the opening end of the receiving grooves, it is possible to hold and support the wafer between the receiving grooves.

The body (42) is supported rotatably with the frame (59) by means of bearings (60), (60) and is capable of rotation of 180 degrees by movement of the pulley (61) provided at the outer circumference thereof by means of a motor (62) through gears (63), (64), a pulley (65) and a toothed belt (66) provided on the frame (59). At the rear end of the body (42), a sensor plate (67) is provided. The movement of the sensor plate (67) is sensed by the sensors (68) provided at predetermined places, and, thereby, the motor (62) is controlled and the movement of the body is stopped in increments of 90 degrees rotation (refer to FIG. 7). Further, on a flange (42a) fixed on the body (42), receiving openings or recesses (69), (70), (71) for determining position are provided at 90 degrees interval. A stop pin (73) located at the end portion of the rod cylinder (72) provided on the frame (59), is inserted into the receiving openings (69), (70), (71) at each situation thereof and thereby the body is maintained at each place thereof so as to remain stationary (refer to FIG. 8).

Figure 4:
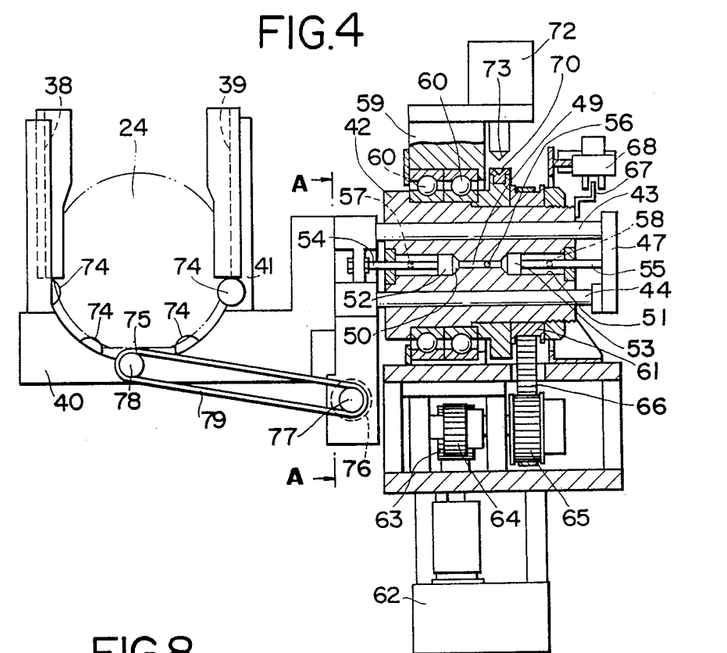
FIG. 4 is a partially cross-sectional side elevational view showing the orientation-flat aligning device.

In accordance with rotation of the body (42) in 90 degree increments, the supporting arms (40), (41) of wafers may vary their positions in three rotational positions, namely, the opening side thereof can be directed to the right and left sides in a horizontal direction and to the upward or vertical direction.

The supporting arms (40), (41) have grooved rollers (74), (74) for receiving wafers and at the base portion of one of the supporting arms (40), a rotating roller (75) to rotate the wafers is provided. The rotating roller (75) is rotated by means of a motor (76), pulleys (77), (78) and an endless belt (79) provided at the base portion of the supporting arm (40).

The orientation-flat aligning device (27) is constructed as mentioned above, thereby the supporting arms (40), (41) receive the wafers (24) therebetween when the supporting arms are directed either to the left or the right. Thereafter, the supporting arms are rotated in such a manner that the opening side thereof moves upward by rotating the body (42). And, the rotating roller (75) is thus rotated by driving the motor (76), thence the wafer (24) the periphery of which is in contact with the rotating roller (75), is driven rotationally, and orientation-flat stops at the position opposite to the rotating roller (75), (refer to FIG. 4). Thereafter, the body (42) rotates in the reverse direction to the above, and when the opening side of the supporting arms turns sideways, the motor is stopped. Thus, the orientation-flat is aligned in position.

Wafer Receiving Device

Under the orientation-flat aligning device is provided a wafer receiving device (80) which receives the wafer from the above device and lowers it (refer to FIG. 2). The wafer receiving device has a holding unit (81) which holds the wafer by vacuum suction and a cylinder unit (82) which moves the holding unit (81) upwardly and downwardly. The holding unit (81) is attached to the rear surface of the wafer maintained in the orientation-flat aligning device, when the cylinder unit (82) is moving upward. In accordance with the operation to expand the space of the supporting arms (40), (41) of the orientation-flat aligning device, the wafer is transferred from the orientation-flat aligning device to the wafer receiving device. The holding unit (81) is lowered while holding the wafer.

Carrying Means

A carrying means (83) is provided to receive wafers from the holding unit of the wafer receiving device, when such holding unit is moved downwardly.

The carrying means is provided to enable alternate motion with placing of wafers on their upper surface between a position for receiving the wafers, a position provided with an adhesive agent coating means and a position provided with a reverse chuck means, as mentioned hereinafter. The interval spaces between each of the above three positions are provided nearly an equal distace apart. The carrier or carrying means may be provided in various types, but in FIGS. 9 and 10, rails (85), (86) are provided on a gate-like frame (84). The rails are of sufficient length to attain a position for receiving the wafers to the position provided with the adhesive agent coating means. The frame (84) having the rails (85), (86) forms base portions (87), (88) at the lower ends thereof respectively. The base portions (87), (88) are passed through downward under the body (89) and are inserted slidably with guide bars (90), (91) provided in the body (89). On the lower surface of the body (89), a cylinder unit (92) is installed and a rod (93) of the cylinder unit is fixed on the base portion (88). At the both ends of the body (89), shock absorbers (94), (94) are provided respectively, and the base portions (87), (88) of the frame abut thereto respectively.

Figures 5, 6, 10, 14:
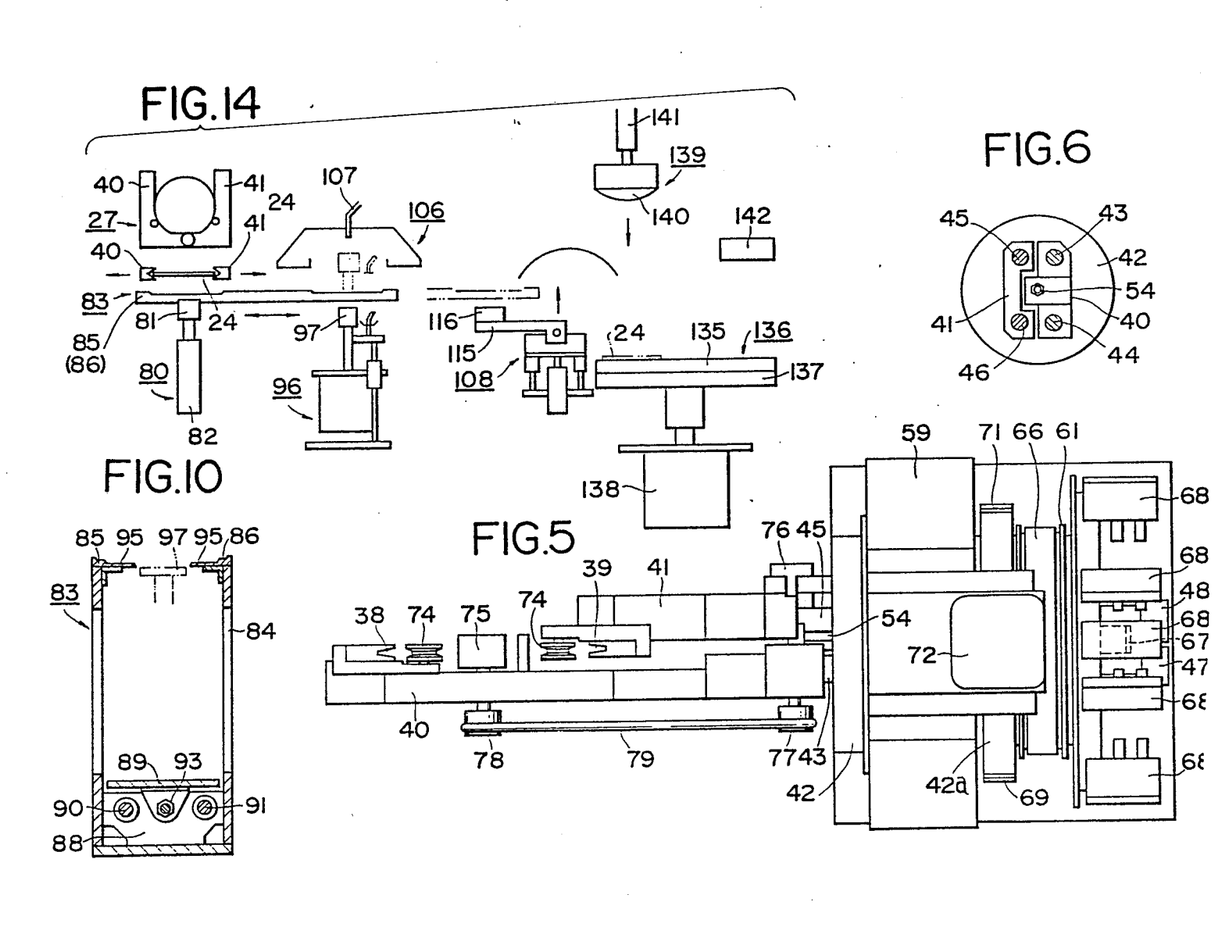
FIG. 5 is an enlarged plane view of the orientation-flat aligning device shown in FIG. 4.
FIG. 6 is a cross sectional view taken along line A—A of FIG. 4.
FIG. 10 is a longitudinal sectional view of the carrying means shown in FIG. 9.
FIG. 14 is an explanatory view showing all process from the automatic treatment of wafers to the adhesion thereof onto the polishing plate in accordance with the present invention.
Figure 7:
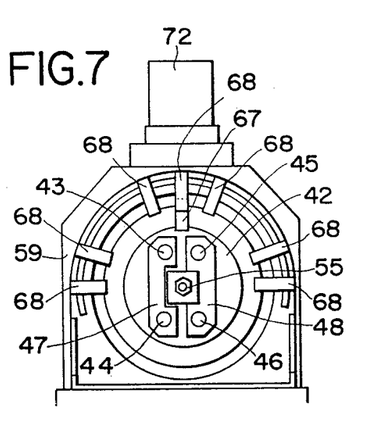
FIG. 7 is a rear view of the orientation-flat aligning device in which a lower portion thereof is omitted.
Figure 8:
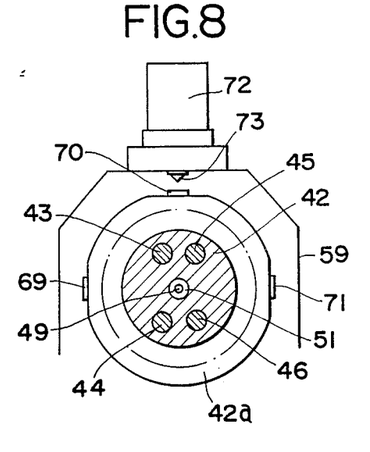
FIG. 8 is a side elevational view of a flange and cylinder unit for determining location of the orientation-flat aligning device in FIG. 4.
Figure 9:
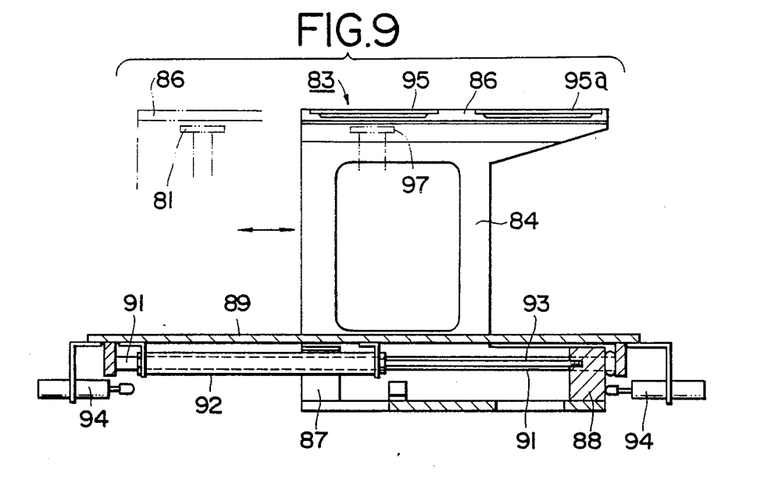
FIG. 9 is a cross sectional view of the carrying means.

On the upper surface of the rails (85), (86) are provided recesses (95), (95a) which have a configuration corresponding to the outside diameters of the wafers and the individual wafers are therein. The interval between the recesses (95), (95a) is nearly equal with the interval between each of the above mentioned means.

In operation of the cylinder unit (92), the rails (85), (86) are moved alternately between the position shown in full lines and the position shown in chain lines, in FIG. 9 and thus they can transfer the wafers received at the chain line position to the full line position.

Coating of Adhesive Agent

A coating section (8) which applies adhesive agent onto the wafers is constructed with a spin chuck means and an adhesive agent coating means as follows:

Spin Chuck Means

Figure 11:
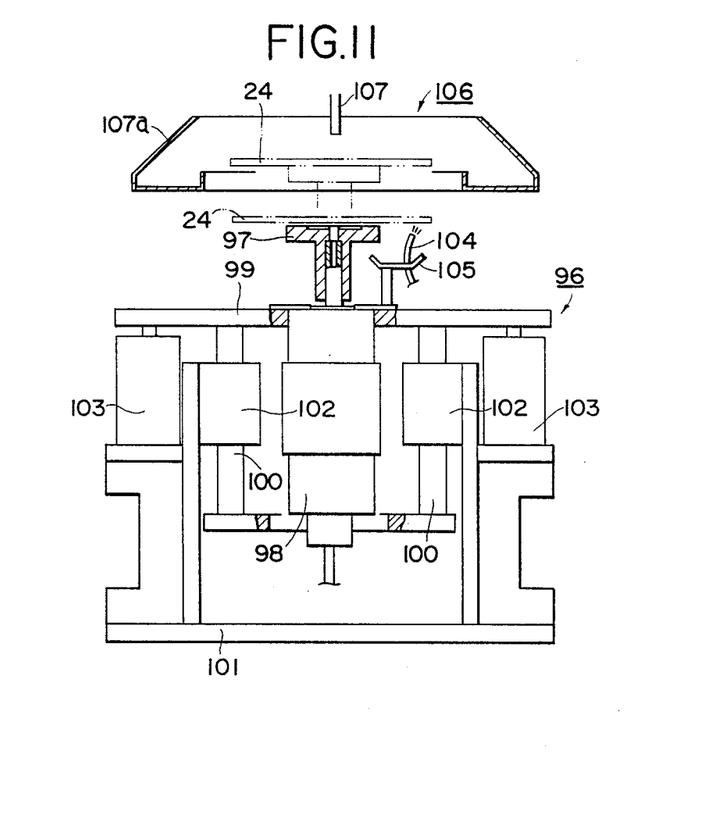
FIG. 11 is a partially cross sectional side elevational view of the spin chuck means and adhesive agent coating means.

A spin chuck means (96) is provided to located between the rails of the carrying means and a body (refer to FIG. 11). The spin chuck means has a holding part (97) which sucks the wafer placed between the rails (85), (86) utilizing vacuum suction and a motor (98) is provided on a frame (99) to rotate the holding part (97). The frame (99) has guide bars (100) and is supported to enable their upward and downward movement by passing through bearings (102) provided in a body (101). In the body (101), cylinders (103), (103) are provided to permit the movement of the frame in upward and downward motion. When the cylinders (103), (103) are in motion, the holding part (97) moves upward and downward with the frame through and between the rails (85), (86) of the carrying means.

On the upper surface of the frame (99), a nozzle (104) permits to spray detergent such as acetone, etc, and a reservoir (105) which collects detergent flow from the nozzle are preferably provided. The head of the nozzle (104) approaches the peripheral edge of the wafer, when the holding part (97) holds the 24, and rinses adhesive agent attached to periphery of reverse side of the wafer with detergent. Utilizing this means, the third washing part (20) mentioned above can be omitted.

Adhesive Agent Coating Means

On the upper side of the spin chuck means (96), a coating device (106) for applying in adhesive agent is provided. The coating device has a wax nozzle (107) which drips adhesive wax dissolved into an organic solvent, and a cover (107a).

When the holding part (97) of spin chuck means (96) is elevated, the holding part holds by suction the wafer placed on the rails (85), (86) of the carrying means, during upward movement. During the upward movement, the wafer is carried into the adhesive agent coating device (106). The wafer is turned rotationally by the holding part (97) and adhesive wax dripped from the wax nozzle (107) thinly coats the surface of the wafer. Thereafter, the holding part (97) moves downward and the wafer coated with adhesive agent is replaced on rails (85), (86) of the carrying means (83) during its downward movement.

Reverse Chuck Means

Figure 12:
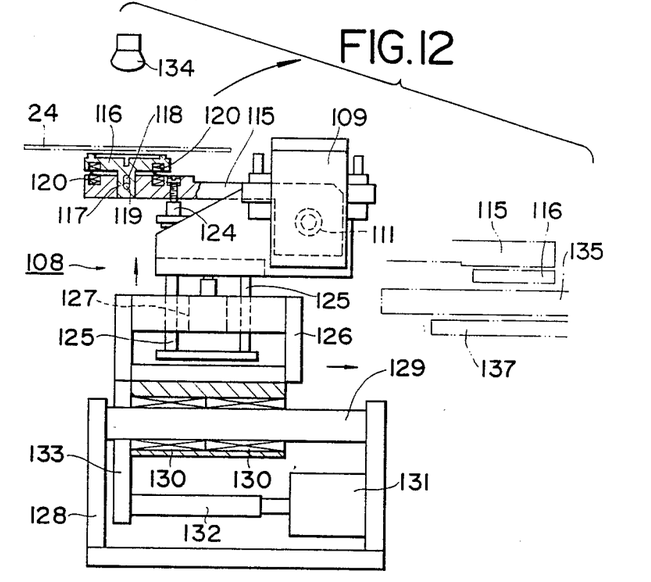
FIG. 12 is a partially cross sectional side elevational view of the reverse chuck means.
Figure 13:
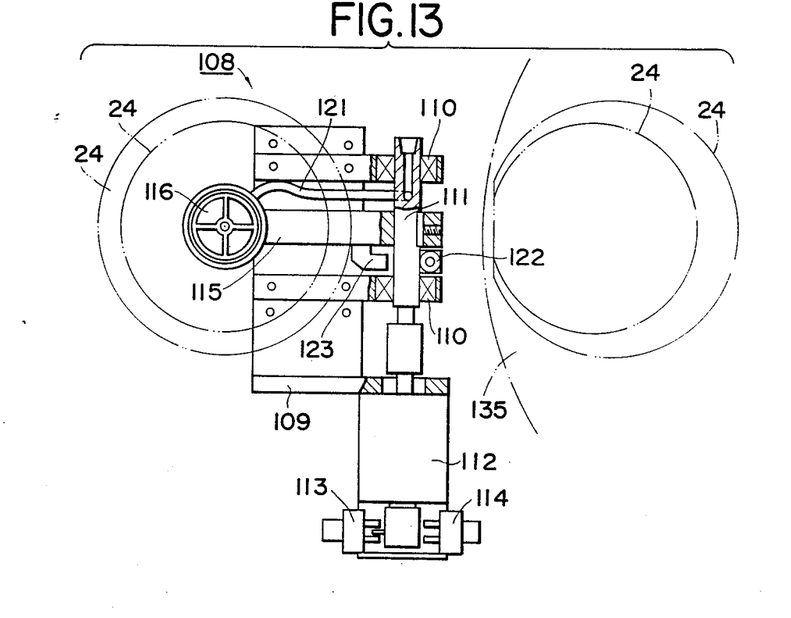
FIG. 13 is a plane view of the reverse chuck means shown in FIG. 12.

An adhesive section (6) which mounts the wafer coated with adhesive agent on the polishing plate is constructed as follows:

At a corresponding location in which the wafer finished coated with adhesive agent is carried, a reverse chuch means (108) is provided (refer to FIGS. 12 and 13). The reverse chuck means has a shaft (111) pivotable in bearings (110), (110) provided on an upper frame (109). The shaft (111) is joined to a rotary actuator (112) and is rotatable from left to right in the range of nearly 180 degrees by controlling the operation of the rotary actuator (112) by sensors (113), (114). On the shaft (111), an arm (115) is fixed, and at the head of the arm (115), a holding unit (116) is provided to hold the wafer (24) by suction. The holding unit (116) has a fitting shaft (117) on the rear side. Fitting shaft (117) is inserted loosely into a fitting hole provided at the end portion of arm (115) and is prevented from slipping out by inserting a pin (119) into a slot (118) formed in the fitting shaft (117). Further, between the holding unit (116) and the arm (115), a spring (120) is provided, and it biases the holding unit (116) to the direction of keeping it apart from the arm. A suction pipe (121) extending to the holding unit (116), is connected to shaft (111) and further connected to the vacuum suction source (not illustrated) from a side of the shaft. At the side of the arm, a shock absorber (122) is provided and when the arm (115) is reversed, a flange (123) provided at the side of the arm abuts the shock absorber. Further, in the position shown in the drawing, the arm (115) abuts a stop (124) and the stop substantially maintains the holding unit (116) in the horizontal direction with its upward orientation.

The upper frame (109) has guide bars (125) extending downwardly and is supported to be moveble upwardly and downwardly by inserting the guide bars (125) through a moving frame (126). On the moving frame (126), a cylinder unit (127) is provided, and by operating the cylinder unit (127), the upper frame (109) is moved upwardly or downwardly.

At the lower part of the moving frame (126), a body (128) is provided. On the body, the moving frame (126) is assembled slidably through bearings (130), (130) to a guide shaft (129) provided on the body. A cylinder unit (131) provided in the body (128) is connected to the lower (133) portion of the moving frame (126) by a piston rod (132) thereof. By operating the cylinder unit (131), the moving frame (126) and the upper frame (109) are transferred in an axial direction along the guide shaft (129).

Thus, the reverse chuck means (108) is provided so that the holding unit (116) thereof is located under and between the rails (85), (86) of the carrying means (83), when the holding unit (116) is turned upward as shown in the drawing. The carrying means stops when the wafer (24) placed on the rails comes to the position just above the head of the holding unit (116). At the side on the near portion of wafers, a heating means (134) such as infrared lamp, etc is provided to evaporate organic solvent such as acetone, etc of the adhesive agent. Exclusion of the organic solvent may be possible by that as mentioned hereunder, when the wafer approaches the heated polishing plate in accordance with rotation of the arm, the movement of the arm stops for a few seconds and transmits heat of the polishing plate to the wafer.

When the wafer (24) is at the position mentioned above, the upper frame (109) moves upward slightly by mean of operation of the cylinder unit (127), and the holding unit (116) absorbingly holds the wafer (24) and takes the wafer from the carrying means. When the rotary actuator (112) is in motion, the arm (115) rotates and the holding unit (116) reverses sides of the wafer (24) and adheres such wafer on the polishing plate (135). (refer to chain lines in FIG. 12). At the time of adherence of the wafer to the polishing plate, the cylinder unit (107) operates and lowers the upper frame (109). By this operation, the wafer is securely adhered to the polishing plate. After adhering of the wafer, the rotary actuator (112) returns the arm (115) to the reverse side and, accordingly, the holding unit (116) returns to its former position as shown in the drawings and is prepared for reversing and adhering the next wafer.

Even if the sizes of wafers are different, e,g, 4, 5 and 6 inches etc, the moving frame (126) is transferred by the cylinder unit (131) so that the position of orientation-flat is almost the same level of the polishing plate (135). Namely, the holding unit (116) is in the above mentioned waiting position for holding the center of the wafer and, accordingly, when the arm (115) rotates, the moving frame (126) is transferred to the polishing plate (135) corresponding to the size of wafer and adheres the wafer onto the polishing plate. The wafer can be adhered to the orientation-flat at the predetermined place of the polishing plate.

Polishing Plate Holding Means

A polishing plate is held by a dividing means.

The dividing means (136), as shown in FIG. 14, has a dividing plate (137) at the upper portion thereof, indexes the position of the polishing plate (135) placed on the upper surface thereof by rotating the dividing plate (137) by means of a step motor (138), receives and adheres the wafer from the reverse chuck means as mentioned above at the predetermined position of the polishing plate. Further, when placing the polishing plate (135) on the dividing plate (137), it is centered. Above the dividing plate (137), a heating means (142) such as a far-infrared heater, etc. is provided, and the dividing plate (137) is kept at a predetermined temperature.

In order to adjust the adhering positions of the polishing plate and the wafer, the dividing means can be provided to enable it's movement in a longitudinal direction (i.e., in the direction approaching to or separating from the reverse chuck means) corresponding to the sizes of the polishing plate and/or the wafers. Solvent remaining on the wafer is evaporated by means of a heating means (142) for heating the polishing plate provided near to the dividing plate.

At the above portion of the dividing means, a stamp or press means (139) is provided to press the wafer mounted on the polishing plate. The stamp means (139) has a pad (140) made of a special rubber or other elastic materials at the lower surface thereof, and presses the wafer (24) to the polishing plate (135) by moving the pad (140) with a cylinder unit, (141).

Explanation of Whole Process

Continuous operations of each means mentioned above can be explained generally as follows:

In FIG. 14, an orientation-flat aligning device (27) receives the wafer (24) in the position that the holding arms (40), (41) are faced sideways, moves the holding arms upward so that they turn to the upright position, and determines the situation of orientation-flat of the wafer. Thereafter, returning the holding arms to the original position, moving upward the holding unit (81) of the wafer receiving device (8) from the lower position, and sucking the wafer on the upper surface of the holding unit (81), and then receiving and supporting the wafer on the holding unit (81) by opening each of the holding arms (40), (41) to the left and right.

The holding unit (81) of the wafer receiving device moves downward after receiving the wafer (24) and during the downward movement, places the wafer on the left side shown in the drawing on the rails (85), (86) of the carrying means (83).

The rails (85), (86) of the carrying means (83) which receive the wafer, move to the right side in the drawing, and carry the wafer above the spin chuck means (96). The holding unit (97) of the spin chuck means (96) elevates and holds the wafer, and carries it into the adhesive agent coating device (106). Therein, adhesive agent is dripped onto the wafer which is rotating or remains stationary. In the latter case, the wafer is rotated after dripping. Thus, adhesive agent is uniformly applied to the upper surface of the wafer.

In the meantime, the rails (85), (86) of the carrying means (83) move to the left in the drawing, and receive the next wafer.

After applying adhesive agent, the holding unit (97) of the spin chuck means (96) is moved downwardly and places the wafer with adhesive agent at the right side in the drawing on rails (85), (86) of the carrying means (83).

Again, the rails of the carrying means (83) move to the right and the wafer with applied adhesive agent and placed on the right part is carried to the upper position of a holding unit (116) of the reverse chuck means (108) (refer to chain line in FIG. 14). At that time, another new wafer placed at the left portion of the rails is carried on the upper position of the spin chuck means as mentioned above.

The holding unit (116) of thhe reverse chuck means (108) is elevated upward and receives the wafer applied with adhesive agent from the carrying means, and adheres the wafer on a polishing plate (135) by rotating arm (115). Thereafter, the holding unit (116) is moved downwardly and the arm is returned to its original position.

The stamp means (139) located above the polishing plate (135) moves downward to the upper surface of the wafer adhered on the polishing plate and presser such wafer, and moves upward.

As mentioned above, after adhering the wafer at the predetermined place of the polishing plate, the step motor (138) of the dividing means (136) operates and rotates the dividing plate (137) to the next position in which a new wafer is to be attached.

Thus, after the required sheets of wafer have been adhered on the polishing plate the polishing plate is carried to the press cooling position (4) by the robot 4, and a new polishing plate is placed by the robot 3 on the upper surface of the dividing plate (137) of the dividing means (136). The above mentioned operations are repeated and adhere the wafer on the polishing plate at full automation. As for a polishing plate, the flat upper surface is shown in the drawings, but if required, the polishing plate may be formed narrow grooves lengthwise and crosswise, etc. on the surface thereof. Further, the narrow holes may be provided at the place on which the wafer is attached. These grooves or holes are useful to escape air in adhesive agent.

The present invention may be embodied in other specific forms without departing from the spirits or essential characteristics thereof. For example, the above mentioned reverse chuck means (108) is constructed to enable to eject the wafers from the carrying means and to reverse the wafer during its transference. Instead of the above constitution, it is possible to be constructed that the reverse chuck means ejects the wafers from the carrying means, and, after transferring it in the direction of a polishing plate and reaching the polishing plate, reverses the side of the wafer at the position of the polishing plate.

Further, the holding unit of the reverse chuck means etc in the present invention, holds the wafer by a vacuum suction operation, but it is possible to hold it by hooks or other suitable means. Further the above chuck means rotates arms provided in the holding unit 180 degrees around the shaft (111), and angle of the rotation may be changed if desired. Further it is possible to provide rotatably the holding unit with the axis of the arms, to rotate the holding unit axially and reverse the sides of the wafer.

The present invention is constructed as mentioned above and accordingly, the wafer can be adhered effectively in full automation. Thus the present invention is useful in the polishing working of the wafer of silicon, gadolinium, gallium, garnet, gallium arsenide, sapphire, crystal, glass, ceramics, etc.

What is claimed is:

1. A wafer mounting device comprising:
   carrying means for transferring wafers, and adhering the wafers one by one onto a polishing plate;
   spin chuck means which is provided for upward and downward movement for receiving wafers from the carrying means during the upward movement thereof, turning the wafers at an upward position of the spin chuck means, and replacing wafers to said carrying means during the downward movement;
   an adhesive agent coating means provided at an upper portion of said spin chuck means for dripping adhesive agent on to said wafers;
   a reverse chuck means for inverting the side of the wafers on which adhesive agent is coated and for ejecting outwardly said wafers from the carrying means; and
   means for holding said polishing plate at a predetermined place so as to adhere the wafers ejected from said carrying means in inverted position onto a surface of said polishing plate.

2. A wafer mounting device in accordance with claim 1, wherein said carrying means is selectively moveable to a position for receiving the wafers, a position provided with said adhesive agent coating means and a position provided with said reverse chuck means.

3. A wafer mounting device in accordance with claim 2, wherein interval spaces between the position for receiving the wafers, the position provided with the adhesive agent coating means and the position provided with the reverse chuck means are provided at a nearly equal distance apart.

4. A wafer mounting device in accordance with claim 1, wherein said reverse chuck means inverts the individual wafers during transference of said wafers.

5. A wafer mounting device in accordance with claim 1, wherein each said wafer is placed oriented flat on the carrying means.

6. A wafer mounting device in accordance with claim 1, wherein said polishing plate is held on the holding means under a heated condition.

7. A wafer mounting device in accordance with claim 6, further including means for prior to adhering the wafers heating said polishing plate gradually.

8. A wafer mounting device in accordance with claim 1, further including means for transferring said polishing plate onto the holding means after mounting of the wafers thereon.

9. A wafer mounting device in accordance with claim 1, wherein said holding means includes means to press the wafers mounted on the polishing plate.

10. A wafer mounting device in accordance with claim 1, wherein said polishing plate has narrow grooves or small holes on the surface thereof.

11. Apparatus for automatically mounting wafers on a polishing surface of individual polishing plates in preparation for being polished thereon comprising, means for supplying a multiplicity of wafers and automatically delivering them individually successively, orientation means for receiving the delivered individual wafers successively and orienting them individually to a horizontal position in which they are to be carried, carrier means reciprocable for transporting the wafers spaced from each other, a first wafer holding unit reciprocable cylically forwardly to receive and releasably hold the oriented wafers individually successively and rearwardly for delivering the wafers successively onto said carrier means, an adhesive coating unit for receiving the individual wafers successively therein and applying an adhesive coating on a surface thereof, a spin chuck having a second wafer holding unit rotatably driven selectively and reciprocable cylically forwardly and rearwardly for removing the wafers individually from the carrier means during forward movement and introducing each wafer individually into said adhesive coating unit and releasably holding each wafer therein during the cooling of adhesive on a surface thereof and during rearward movement replacing coating wafers individually on the carrier means with the adhesive coated surface thereof exposed; a reverse chuck having a third holding unit reciprocable cyclically forwardly and rearwardly for removing the wafers individually successively from the carrier means during forward movement and releasably holding the wafers thereon with the adhesive coated surface exposed during rearward movement for subsequently adhering each wafer on the polishing surface of a respective polishing plate, the reverse chuck having means for moving it cyclically to position the reverse chuck in a position for removing the wafers individually successively from the carrier means and after removal shifting the reverse chuck relative to the carrier means to a position in readiness for mounting the wafers successively on the respective polishing plate and then returning the reverse chuck to said position for removing the wafers from the carrier means, the reverse chuck having a mounting arm cylically rotated for rotating the reverse chuck and said third holding unit thereof in an arc for inverting the position of the individual wafers and mounting the wafers individually with the adhesive coated surface disposed on the polishing surface of the respective polishing plates for adhering them thereon, and means for indexing the individual polishing plates in timed relationship with the cylical reversing of the individual wafers for mounting the wafers adhered on a respective polishing plate in positions spaced from each other with an exposed surface thereof opposite to the adhesive coated surface in readiness for polishing thereof.

12. Apparatus for automatically mounting wafers on a polishing surface of individual polishing plates, in accordance with claim 11, in which said wafers are planar, and in which said orientation means comprises means for orienting the wafers for flat surfaces thereof to be disposed horizontal during carrying thereof.

13. Apparatus for automatically mounting wafers on a polishing surface of individual polishing plates according to claim 11, in which said spin chuck comprises means for spinning the second holding unit thereof during coating of the individual wafers with an adhesive on said surface thereof, whereby the adhesive uniformly coats said surface of the individual wafers.

14. Appartus for automatically mounting wafers on a mounting surface of individual polishing plates according to claim 13, further including means on the spin chuck for applying a detergent on a surface of the individual wafers opposite to the surface on which an adhesive is applied.

15. Apparatus for automatically mounting wafers on a polishing surface of individual polishing plates according to claim 11, further including heating means for gradually heating the polishing surface of the polishing plates in preparation for adhering the wafers thereon.

16. Apparatus for automatically mounting wafers on a polishing surface of individual polishing plates, according to claim 15, in which said heating means comprises a heat lamp.

17. Apparatus for automatically mounting wafers on a polishing surface of individual polishing plates according to claim 11, further including means for pressing the individual wafers into the polishing surface of the polishing plates when the wafers are mounted thereon for better adhering the wafers thereon.

18. Apparatus for automatically mounting wafers on a polishing surface of individual polishing plates according to claim 11, including means for heating the exposed surface of the wafers when mounted on the polishing surface of the individual polishing plates to drive off solvents therefrom.

19. Apparatus for automatically mounting wafers on a polishing surface of individual polishing plates according to claim 11, in which each of said first, second and third holding units comprises a suction device for developing a vacuum suction for releasably holding the individual wafers thereon and removing the vacuum suction to release the individual wafers when placed on the carrier means and mounted on the polishing surface of a respective polishing plate.

* * * * *